United States Patent [19]
Chang

[11] Patent Number: 5,985,520
[45] Date of Patent: Nov. 16, 1999

[54] METAL LINE STRUCTURE AND METHOD OF MANUFACTURING THE SAME

[75] Inventor: Ming-Lun Chang, Hsinchu, Taiwan

[73] Assignee: Winbond Electronics Corp., Hsinchu, Taiwan

[21] Appl. No.: 08/998,600

[22] Filed: Dec. 29, 1997

[30] Foreign Application Priority Data

Oct. 8, 1997 [TW] Taiwan ................................ 86114719

[51] Int. Cl.[6] ........................................................ G03F 7/26
[52] U.S. Cl. ........................... 430/313; 430/318; 216/2; 216/77; 216/78; 438/585; 438/595
[58] Field of Search ................................ 430/313, 318; 216/2, 77, 78; 438/585, 595

[56] References Cited

U.S. PATENT DOCUMENTS 4,745,045  5/1988  Fredericks et al. ..................... 430/313

*Primary Examiner*—Hoa Van Le
*Attorney, Agent, or Firm*—Rabin & Champagne, P.C.

[57] ABSTRACT

A method for forming a metal line structure comprising the steps of providing a semiconductor substrate, and then sequentially forming a metallic layer and an insulating layer over the substrate. Next, photolithographic and etching processes are performed to create a pattern on the insulating layer exposing portions of the metallic layer and forming insulating lines. Then, spacers are formed on the sidewalls of the insulating lines. Thereafter, the metal layer is etched using the insulating lines and the spacers as masks, and the substrate as an etching stop layer. The metal etching also removes the insulating lines. Thus, the top surface of the metallic layer is exposed and the metal line structure that has the characteristic sloping sidewalls of this invention is formed. These outward sloping sidewalls of the metal lines form slanted edges with the semiconductor substrate, and provide a good step coverage for subsequently deposited layer.

16 Claims, 5 Drawing Sheets

METAL LINE STRUCTURE AND METHOD OF MANUFACTURING THE SAME

BACKGROUND OF THE INVENTION

1. Field of Invention

The present invention relates to a metal line structure and its method of manufacture. More particularly, the present invention relates to a metal line structure having slanted edges on two sides for enhancing step coverage in a subsequent deposition process.

2. Description of Related Art

For most very large scale integrated (VLSI) circuits, when fabrication of the MOS transistors is nearly complete, metal layers have to be formed over the substrate to connect various transistors or other device units. The metal layers that connect various transistors or other devices are known as "metal lines". Following the recent increase in the level of integration for VLSI circuits, distances between different devices become smaller. Hence, density of the metal lines will correspondingly increase. Furthermore, since these metal lines actually serve as conducting wires, it needs to climb over, for example, a multiple of insulating field oxide layers in a three-dimensional way in order to link up the various devices in different locations.

FIG. 1A and 1B are two cross-sectional views showing the progression of manufacturing steps in producing a conventional metal line structure. First, as shown in FIG. 1A, on a semiconductor substrate 10 that has a transistor already formed thereon, metal is deposited to form a metallic layer 12. The metal can be deposited using a sputtering method. In general, a thin layer of anti-reflective coating (ARC) will also coated on top of the metallic layer 12. Thereafter, photolithographic and etching processes are carried out to create a pattern in the metallic layer 12. The method is to form a photoresist layer over the metallic layer 12, and then patterning the photoresist layer. Next, using the photoresist layer as a mask, anisotropic dry etching is performed to etch away portions of the metallic layer 12 forming an opening 16 that exposes the substrate 10. Thus, a metal line structure is complete, and it is not difficult to see that the sidewalls of these metal lines 12 are near vertical.

Next, as shown in FIG. 1B, a chemical vapor deposition (CVD) method is used to deposit a dielectric layer 18 over the metal lines 12, and filling the opening 16 as well. Because the sidewalls 17 of the metal lines 12 are near vertical, so the deposited dielectric layer 18 will form an overhang at the upper corner of the metal lines 12 in general. This is due to poor step coverage by the deposited dielectric material. The overhang is actually a thick formation of the dielectric layer 18 at the upper corner locations. When the overhangs on each upper corner of the metal lines meet, a void 19 will be formed in the opening 16. A void in the dielectric layer 18 will eventually affect the stability of the connected devices.

Since the current trend in semiconductor manufacturing is towards device miniaturization, spacing between metal lines 12 is going to be smaller. Therefore, the step coverage ability for the deposited dielectric material is bound to get worse, and overhangs and voids are going to be more numerous.

In light of the foregoing, there is a need in the art to provide a better metal line structure and method of manufacture.

SUMMARY OF THE INVENTION

Accordingly, the present invention is directed to provide a metal line structure and its method of manufacture that can increase the step coverage of deposited material during subsequent deposition over the metal lines.

To achieve these and other advantages and in accordance with the purpose of the invention, as embodied and broadly described herein, the invention provides a method for forming a metal line structure. The method comprises the steps of providing a semiconductor substrate, and then sequentially forming a metallic layer and an insulating layer over the substrate. Next, photolithographic and etching processes are performed to create a pattern on the insulating layer exposing portions of the metallic layer and forming insulating lines. Then, spacers are formed on the sidewalls of the insulating lines. Thereafter, the metal layer is etched using the insulating lines and the spacers as masks, and the substrate as an etching stop layer. The metal etching also removes the insulating lines. Thus, the top surface of the metallic layer is exposed and the metal line structure that has the characteristic sloping sidewalls of this invention is formed. These outward sloping sidewalls of the metal lines form an angle with the semiconductor substrate, and can provide good step coverage for subsequently deposited layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
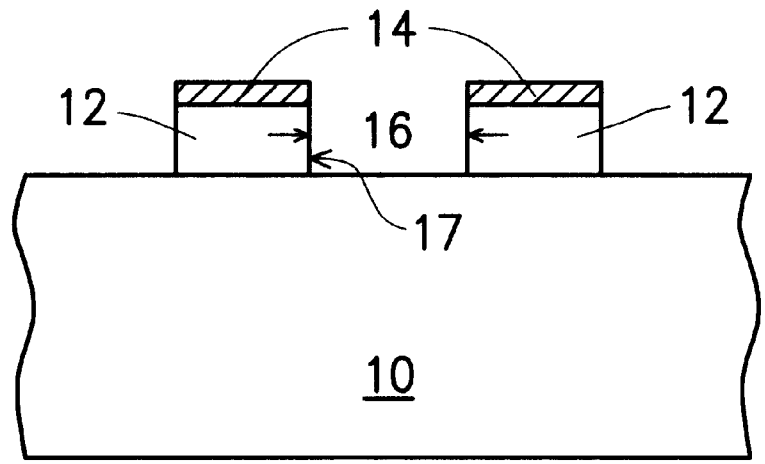
FIGS. 1A and 1B are two cross-sectional views showing the progression of manufacturing steps in producing a conventional metal line structure.
Figure 1B:
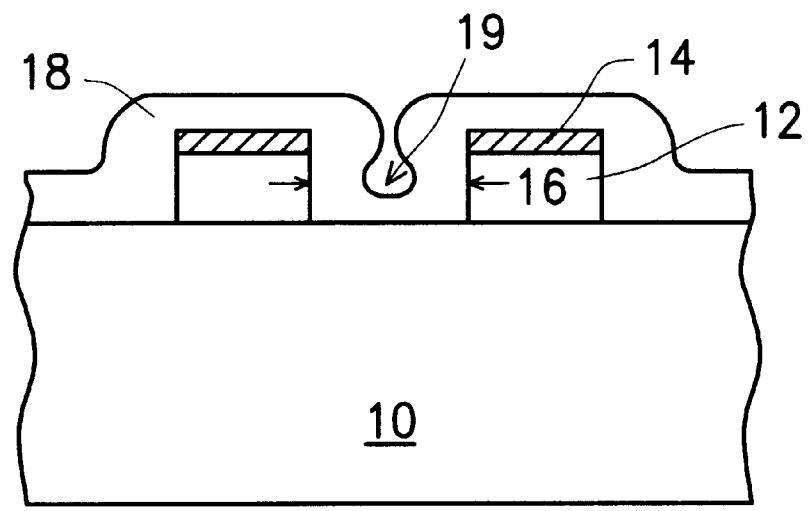

Reference will now be made in detail to the present preferred embodiments of the invention, examples of which are illustrated in the accompanying drawings. Wherever possible, the same reference numbers are used in the drawings and the description to refer to the same or like parts.

The idea of this invention is to form a mask having a spacer structure over the metallic layer. Therefore, when the metallic layer is subsequently etched, the spacer-shaped mask will function as a guide streamlining the etching operation such that a gradual sloping edge is created on the sidewalls of the metal lines. Such sloping sidewall structure is able to increase the step coverage in subsequently deposited material over the metal lines. Consequently, overhangs and voids that form on the sidewalls of metal lines when a conventional method is used can be prevented.

Figure 2A:
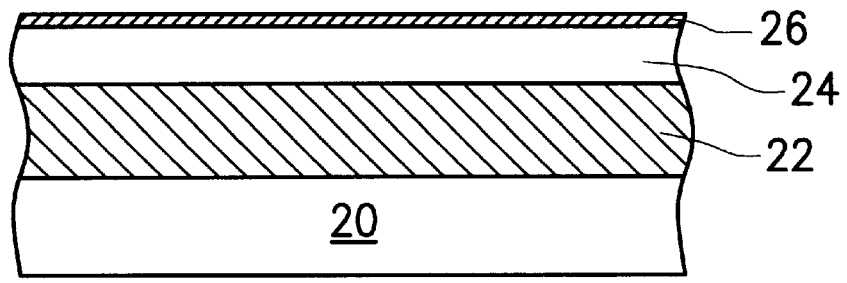
FIGS. 2A and 2F are cross-sectional views showing the progression of manufacturing steps in producing a metal line structure according to a first preferred embodiment of this invention.
Figure 2B:
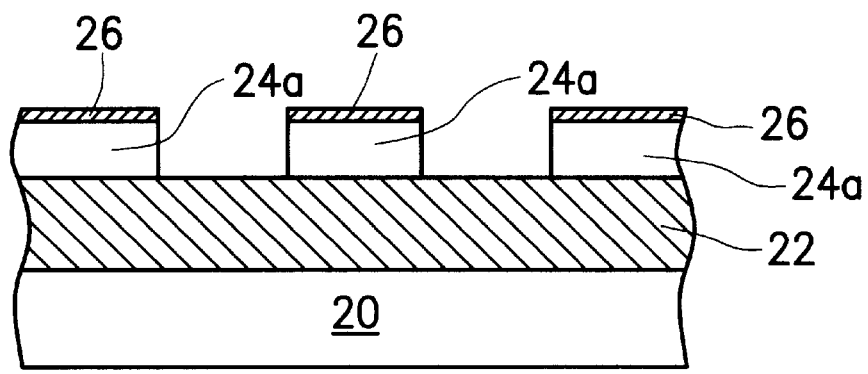
Figure 2C:
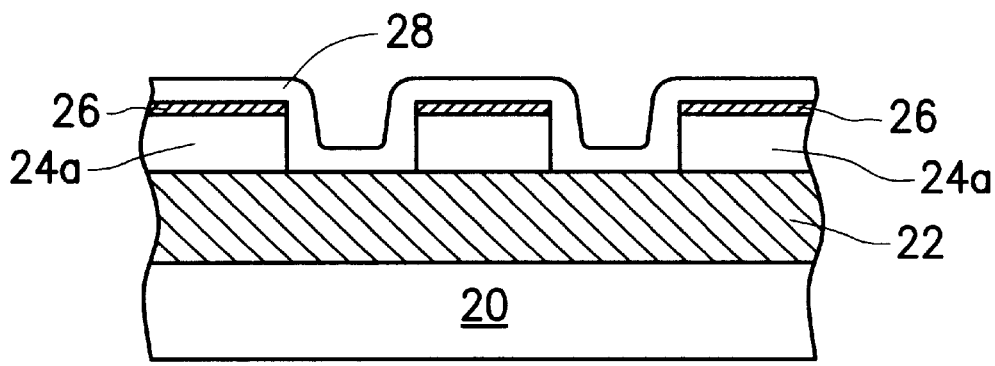
Figure 2D:
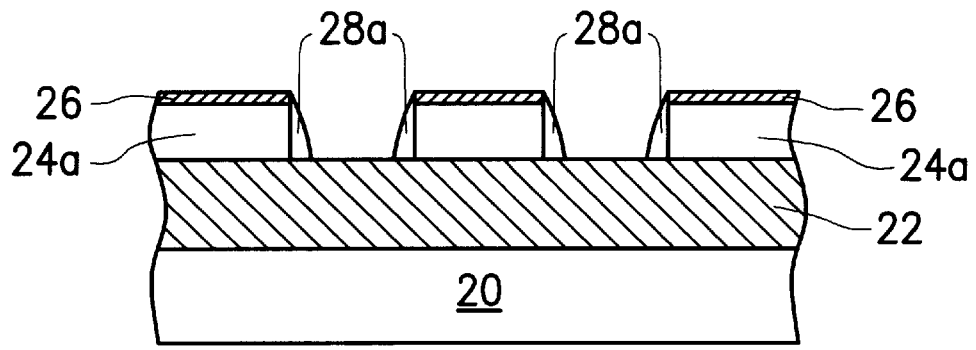
Figure 2E:
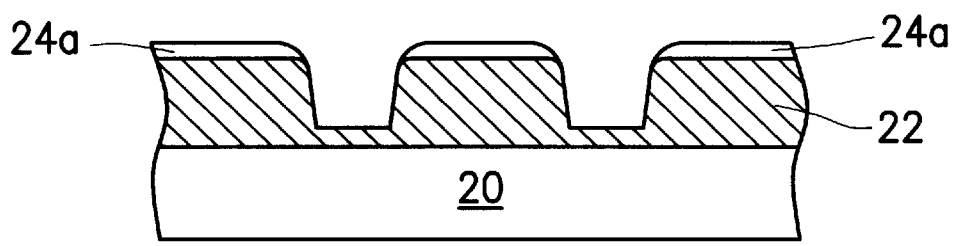
Figure 2F:
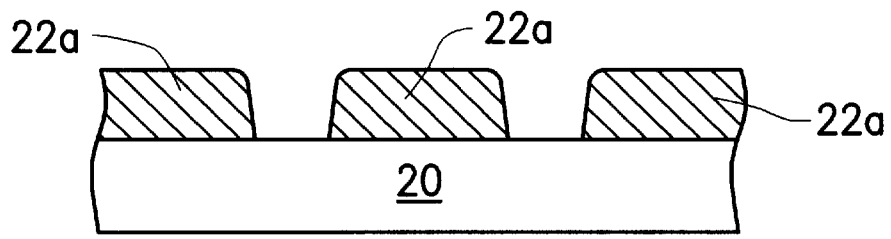

FIGS. 2A and 2F are cross-sectional views showing the progression of manufacturing steps in producing a metal line structure according to a first preferred embodiment of this invention.

First, as shown in Fiu. 2A, a semiconductor substrate 20 that has at least one transistor (not shown in the FIG.) formed thereon is provided. Then, a metallic layer 22, a first insulating layer 24, and an anti-reflection layer 26 are sequentially formed over the substrate 20. The metallic layer 22 is preferably formed by sputtering metal over the substrate 20. The anti-reflection layer 26 is preferably a titanium nitride (TiN) layer. The first insulating layer 24 is preferably an oxide formed using a chemical vapor deposition (CVD) method or a plasma-enhanced chemical vapor deposition (PECVD) method. Thickness of the first insulating layer 24 is determined by the thickness of the metallic layer 22 and the etching selectivity ratio (the etching rate between the metallic layer and the oxide layer) of the metallic layer 22. For example, if the metallic layer 22 has a thickness of about 8000 Å and the etching selectivity ratio of the metallic layer 22 is 4, then the thickness of the first insulating layer 24 has to be 8000 Å/4=2000 Å. Furthermore, if consideration must be made concerning the over-etching of the metallic layer 22, then extra thickness has to be added to the first insulating layer 24 to account for such over-etching. For example, if the over-etching is in the range of 50% to 80%, then an extra thickness of about 1000 Å to 1600 Å must be added.

Next, as shown in FIG. 2B, photolithographic and etching processes are performed by first coating a photoresist layer (not shown) over the anti-reflection layer 26, and then patterning the photoresist layer. Using the photoresist layer as a mask, the first insulating layer 24 and the anti-reflection layer 26 are etched to expose portions of the metallic layer 22 using an anisotropic dry etching method, and forming insulating line structure 24a. The insulating line structure 24a here has a pattern that corresponds to the desired metal line pattern below.

Next, as shown in FIG. 2C, a second insulating material is deposited over the insulating lines 24a, the anti-reflection layer 26 and the exposed metallic layer 22 to form a second insulating layer 28. The second insulating layer 28 is preferably an oxide layer, and has a thickness roughly equal to the first insulating layer 24. The oxide layer is termed by using a chemical vapor deposition (CVD) method or a plasma-enhanced chemical vapor deposition (PECVD) method.

Next, as shown in FIG. 2D. the second insulating layer 28 is etched back to form a spacer structure 28a on the sidewalls of the insulating lines 24a. The spacers 28a and the insulating lines 24a are both oxides.

Next, as shown in FIG. 2E, using the insulating lines 24a, the anti-reflection layer 26 and the spacers 28a as masks and the substrate 20 as a stop layer, the metallic layer 22 is etched. The insulating lines 24a will also be etched along with the metal. Therefore, by the time the etching is finished, the insulating lines 24a will be completely etched away exposing the upper surface of the metal layer as shown in FIG. 2F. The sidewalls of the metal lines 22a formed after the etching operation is slanted edges, which slopes outward from the top down towards the substrate 20. Such slated edges are formed because the etching of the metallic layer is guided by the spacer profile. The sloping sidewall structure serves to increase the step coverage in subsequent deposition of material over the metal lines. Therefore, overhangs and voids that are formed on the sidewalls of metal lines by using a conventional method can be prevented.

Figure 3A:
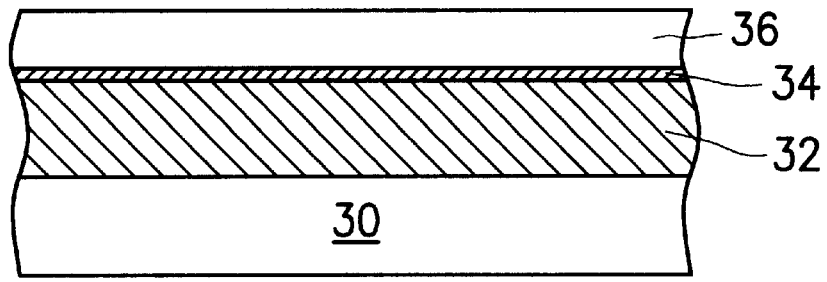
FIGS. 3A and 3F are cross-sectional views showing the progression of manufacturing steps in producing a metal line structure according to a second preferred embodiment of this invention.
Figure 3B:
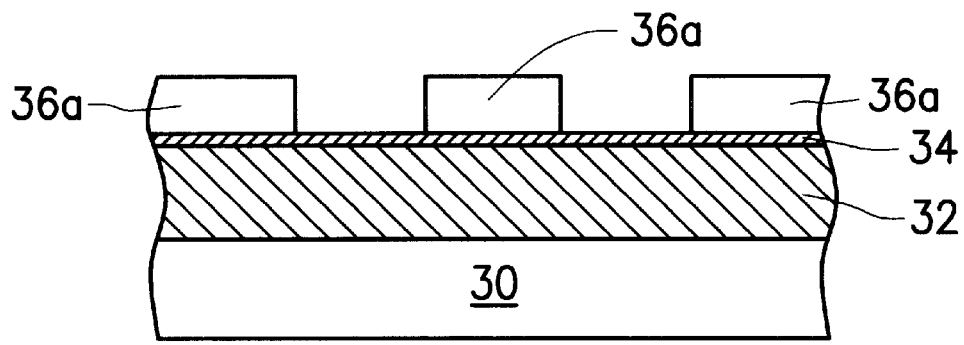
Figure 3C:
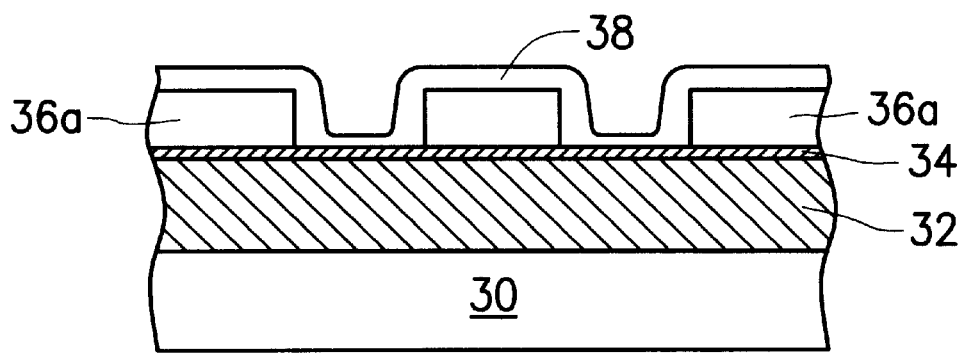
Figure 3D:
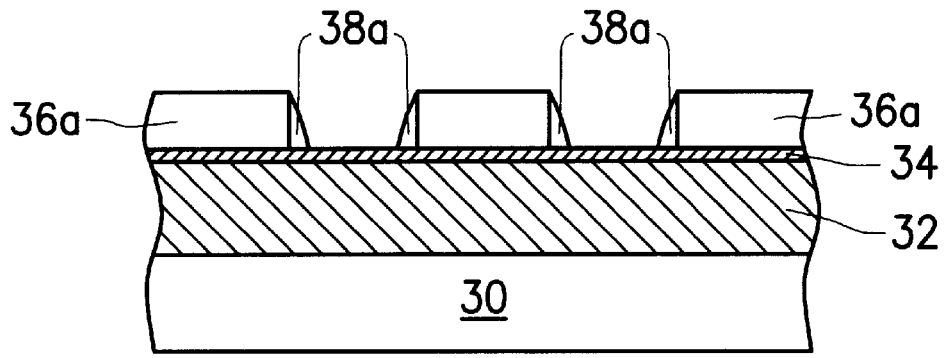
Figure 3E:
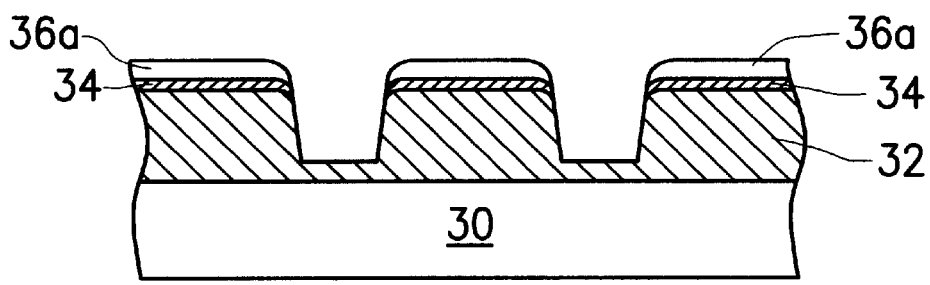
Figure 3F:
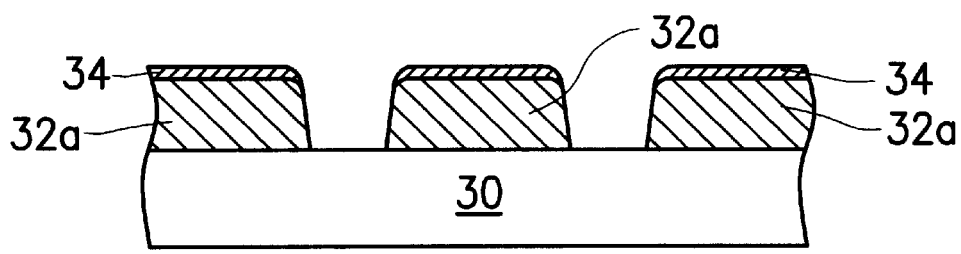

FIGS. 3A and 3F are cross-sectional views showing the progression of manufacturing steps in producing a metal line structure according to a second preferred embodiment of this invention. In this second preferred embodiment, what is different from the first embodiment is an additional anti-reflection layer on top of the final metal line structure. The anti-reflection layer serves to reduce strong reflection of light from the top metal line surface leading to processing difficulties in subsequent operations.

First, as shown in FIG. 3A, a semiconductor substrate 30 that has at least one transistor (not shown in the FIG.) formed thereon is provided. Then, a metallic layer 32, an anti-reflection layer 34, and a first insulating layer 36 are sequentially formed over the substrate 30. The metallic layer 32 is preferably formed by sputtering metal over the substrate 30. The anti-reflection layer 34 is preferably a titanium nitride (TiN) layer. The first insulating layer 36 is preferably an oxide formed using a chemical vapor deposition (CVD) method or a plasma-enhanced chemical vapor deposition (PECVD) method. Thickness of the first insulating layer 36 is determined by the thickness of the metallic layer 32 and the etching selectivity ratio (the etching rate between the metallic layer and the oxide layer) of the metallic layer 32.

Next, as shown in FIG. 3B, photolithographic and etching processes are performed by first coating a photoresist layer (not shown) over the first insulating layer 36, and then patterning the photoresist layer. Using the photoresist layer as a mask, the first insulating layer 36 is etched using an anisotropic dry etching method with the anti-reflection layer 34 as a stop layer, and forming insulating line structure 36a. The insulating line structure 36a here has a pattern that corresponds to the desired metal line pattern below.

Next, as shown in FIG. 3C, a second insulating material is deposited over the insulating lines 36a and the exposed anti-reflection layer 34 to form a second insulating layer 38. The second insulating layer 38 is preferably an oxide layer, and has a thickness roughly equal to the first insulating layer 36. The oxide layer is formed by using a chemical vapor deposition (CVD) method or a plasma-enhanced chemical vapor Next, as shown in FIG. 3D, the second insulating layer 38 is etched back to form a spacer structure 38a on the sidewalls of the insulating lines 36a. The spacers 38a and the insulating lines 36a are both oxides.

Next, as shown in FIG. 3E. using the insulating lines 36a and the spacers 38a as masks and the substrate 30 as a stop layer, the anti-reflection layer 34 and the metallic layer 32 are etched. The insulating lines 36a will also be etched along with the metal. Therefore, by the time the etching is finished, the insulating lines 36a will be completely etched away exposing the top surface of the anti-reflection layer 34 as shown in FIG. 3F. The sidewalls of the metal lines 32a formed after the etching operation are slanted edges, sloping from the top outward down towards the substrate 30. The edges are slanted because the etching of the metallic layer 32 is guided by the spacer profile. The sloping sidewall structure serves to increase the step coverage in subsequent deposition of material over the metal lines 32a. Therefore, overhangs and voids that are formed on the sidewalls of metal lines by using a conventional method can be prevented.

As a summary, the metal line structure provided by the invention includes the following advantages:

(1) The utilization of a mask having a spacer structure helps to guide the subsequent etching of the metallic layer. The etching will roughly follow the edge profile of the spacers. Therefore, a gradual downward and outward sloping profile is obtained for the sidewalls of the metal lines.

(2) The slanted sidewalls of the metal lines in this invention make good step coverage for the subsequently deposited material over the metal lines. Therefore, overhangs and voids created by using a conventional method can be prevented.

(3) The mask used in the etching of the metallic layer is an oxide layer instead of a photoresist mask in a conventional method. In the conventional method, to prevent the removal of the photomask during the etching operation, thickness of the photoresist layer has to be increased. This leads to a poorer resolution and resulting in a larger metal line pitch. However, in this invention, the oxide layer is first patterned before using it as a mass. Since the selectivity ratio between oxide and photoresist is better than the ratio between metal and photoresist, a thinner photoresist layer can be used. Hence, pattern resolution is increased, which is good for the dimensional reduction of devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing metal lines comprising the steps of:
   providing a semiconductor substrate having at least one transistor device formed thereon;
   forming a metallic layer over the semiconductor substrate;
   forming an insulating layer over the metallic layer;
   patterning the insulating layer using photolithographic and etching processes to expose portions of the metallic layer and forming an insulating line structure;
   forming spacers on the sidewalls of the insulating lines; and
   etching the metallic layer, using the insulating layer and the spacers as masks, and using the substrate as a stop layer, such that eventually all the insulating lines are removed exposing the upper surface of the metallic layer and forming metallic lines that have a slanted sidewall structure.

2. The method of claim 1, wherein after the step of forming the insulating layer, further includes forming an anti-reflection layer over the insulating layer.

3. The method of claim 1, wherein the step of forming the insulating layer includes using a chemical vapor deposition method.

4. The method of claim 1, wherein the step of forming the insulating layer includes using a plasma-enhanced chemical vapor deposition method.

5. The method of claim 1, wherein the step of forming the insulating layer includes depositing oxide material.

6. The method of claim 1, wherein the step of forming the spacers includes depositing oxide material.

7. The method of claim 1, wherein the step of forming the spacers includes depositing a second insulating layer over the insulating lines and the exposed metallic layer, and then etching back the second insulating layer to form spacers on the sidewalls of the insulating lines.

8. The method of claim 7, wherein the step of depositing the second insulating layer includes using a chemical vapor deposition method.

9. The method of claim 7, wherein the step of depositing the second insulating layer includes using a plasma-enhanced chemical vapor deposition method.

10. The method of claim 1, wherein the step of forming the slanted sidewall structure includes shaping the sidewalls of the metal line such that it slopes outward on moving down towards the substrate.

11. The method of claim 1, wherein the slanted sidewall structure is formed for enhancing the step coverage ability of subsequently deposited layer.

12. A method for manufacturing metal lines comprising the steps of:
    providing a semiconductor substrate having at least one transistor device already formed thereon;
    forming a metallic layer over the semiconductor substrate;
    forming an anti-reflection layer over the metallic layer;
    forming an insulating, layer over the anti-reflection layer;
    patterning the insulating layer using photolithographic and etching processes to expose portions of the anti-reflection layer and forming an insulating line structure;
    forming spacers on the sidewalls of the insulating lines; and
    etching the anti-reflection layer and the metallic layer, using the insulating layer and the spacers as masks, and using the substrate as a stop layer, such that eventually all the insulating lines are removed exposing the surface of the anti-reflection layer and forming metallic lines that have a slanted sidewall structure.

13. The method of claim 12, wherein the step of forming the insulating layer includes using a plasma-enhanced chemical vapor deposition method.

14. The method of claim 12, wherein the step of forming the spacers includes depositing a second insulating layer over the insulating lines and the exposed anti-reflection layer, and then etching back the second insulating layer to form spacers on the sidewalls of the insulating lines.

15. The method of claim 14, wherein the step of forming the second insulating layer includes using a plasma-enhanced chemical vapor deposition method.

16. The method of claim 12, wherein the step of forming the slanted sidewall structure includes shaping the sidewalls of the metal line such that it slopes outward on going down towards the substrate.

* * * * *